United States Patent [19]

Best

[11] Patent Number: 4,476,402
[45] Date of Patent: Oct. 9, 1984

[54] VMOS-FET IMPATT DIODE PULSE BIAS CIRCUIT

[75] Inventor: Wronald S. Best, Ridgecrest, Calif.

[73] Assignee: The United States of America as represented by the Secretary of the Navy, Washington, D.C.

[21] Appl. No.: 383,918

[22] Filed: Jun. 1, 1982

[51] Int. Cl.³ .......................... H03K 3/26; H03K 3/01
[52] U.S. Cl. ............................. 307/270; 307/296 R; 307/297; 307/318; 361/91
[58] Field of Search .................. 307/317 R, 318, 319, 307/270, 297 R; 361/91

[56] References Cited

U.S. PATENT DOCUMENTS 3,612,914 10/1971 Evans .................................. 307/318
4,251,742 2/1981 Beelitz ............................. 307/317 R Primary Examiner—Stanley D. Miller
Assistant Examiner—B. P. Davis
Attorney, Agent, or Firm—R. F. Beers; W. Thom Skeer; W. D. English

[57] ABSTRACT

This invention describes a VMOS-FET, IMPATT diode pulse bias circuit designed to provide a Gallium Arsenide IMPATT diode with a specified operating voltage and current under required conditions to generate an RF pulse.

14 Claims, 2 Drawing Figures

VMOS-FET IMPATT DIODE PULSE BIAS CIRCUIT

BACKGROUND OF THE INVENTION

1. Field of the Invention

This invention relates to the field of electronics. More exactly, this invention relates to solid state VMOS-FET electronic devices. More particularly, but without limitation thereto, this invention describes a VMOS-FET IMPATT diode pulse bias circuit designed to provide Gallium Arsenide (GaAs) double drift Impact Avalanche Transit Time (IMPATT) diodes with a specified operating voltage and current under required pulse conditions.

2. Description of the Prior Art

In the past, IMPATT diode pulse bias circuits have been constructed using discrete power bipolar transistors as the output device, and the pulse forming network has been built using discrete bipolar switching transistors. The primary disadvantage of this type of design is the limitation due to the selected output transistor. The bipolar transistor exhibits a maximum power efficiency when operated into saturation, but the saturation operation is not achievable in this application due to the necessity of achieving fast rise and fall times for the voltage/current pulses. The bipolar transistor will not switch quickly under saturated operation because of the device energy storage characteristics. Once the bipolar transistor is into saturation, the base circuit of the transistor capacitively stores energy. This stored energy must be dissipated during turn off, thus increasing the turn off time of the saturated bipolar transistor. To remedy this problem, the bipolar transistor is operated in the switching mode to minimize energy storage problems. In this way, fast rise and fall time are achievable, but at the cost of energy efficiency. During the switching mode of operation, a larger voltage is seen across the output transistor than during the saturation mode. This increase indicates that the device is no longer operating in its most efficient mode. Similar energy storage and efficiency problems can also be found in the pulse forming network when discrete bipolar devices are used. Saturated operation must be closely monitored to alleviate pulse distortion in the pulse forming network.

N-channel power VMOS-FETs have also been used as output transistors to control the current flow to IMPATT devices. The n-channel VMOS-FET transistor requires a special driver circuit when used in the source follower configuration, which is required for this application. The problem with this configuration is the associated transistor gate drive circuitry. The gate drive circuit must either be transformer coupled to the transistor, or must have a switching network connected between the transistor gate and source. The transformer coupling scheme is usable for applications where voltage rise and fall times can exceed 50 nanoseconds. This slow rise/fall time generally makes this circuit configuration usable ony for pulse widths in excess of one microsecond. The switching network scheme allows voltage rise/fall times faster than 50 nanoseconds, but the pulse width generally cannot exceed 500 nanoseconds due to problems with the switching network remaining stable. When the switching network becomes unstable, the VMOS-FET transistor begins to shut off if the gate-to-source voltage decreases. This situation does not allow the proper current to flow to the IMPATT diode and, in turn, the IMPATT diode does not produce the required output radio frequency (RF) power.

SUMMARY OF THE INVENTION

This invention provides a circuit consisting of TTL Integrated Circuits utilizing p-channel VMOS-FET transistors capable of supplying high voltage and current with rapid rise and fall times to an IMPATT diode to produce an RF pulse, while concomitantly providing a protection circuit to prevent shorting of the IMPATT diode.

OBJECTS OF THE INVENTION

It is an object of the invention to provide a pulsed constant current supply to an IMPATT diode.

It is also an object of the present invention to provide a rapid rise and fall time of the pulsed high voltage and current to an IMPATT diode.

Another object of the present invention is to provide for a protection circuit for active shut down of the system in the event of IMPATT diode short circuit.

Still another object of the present invention is to provide a circuit utilizing digital integrated circuits as a pulse forming network as opposed to using discrete bipolar transistors.

Still another object of the present invention is to utilize p-channel VMOS power FETs as a pulse bias control device for IMPATT diodes.

A further object of the present invention is to provide a pulse level control circuit utilized to vary the output amplitude of a TTL to CMOS driver to control the magnitude at which the output p-channel VMOS-FET transistor is turned on.

These and further objects of the present invention will become more obvious in view of the attached drawings and the following description of the preferred embodiment.

DESCRIPTION OF THE PREFERRED EMBODIMENT

Figure 1:
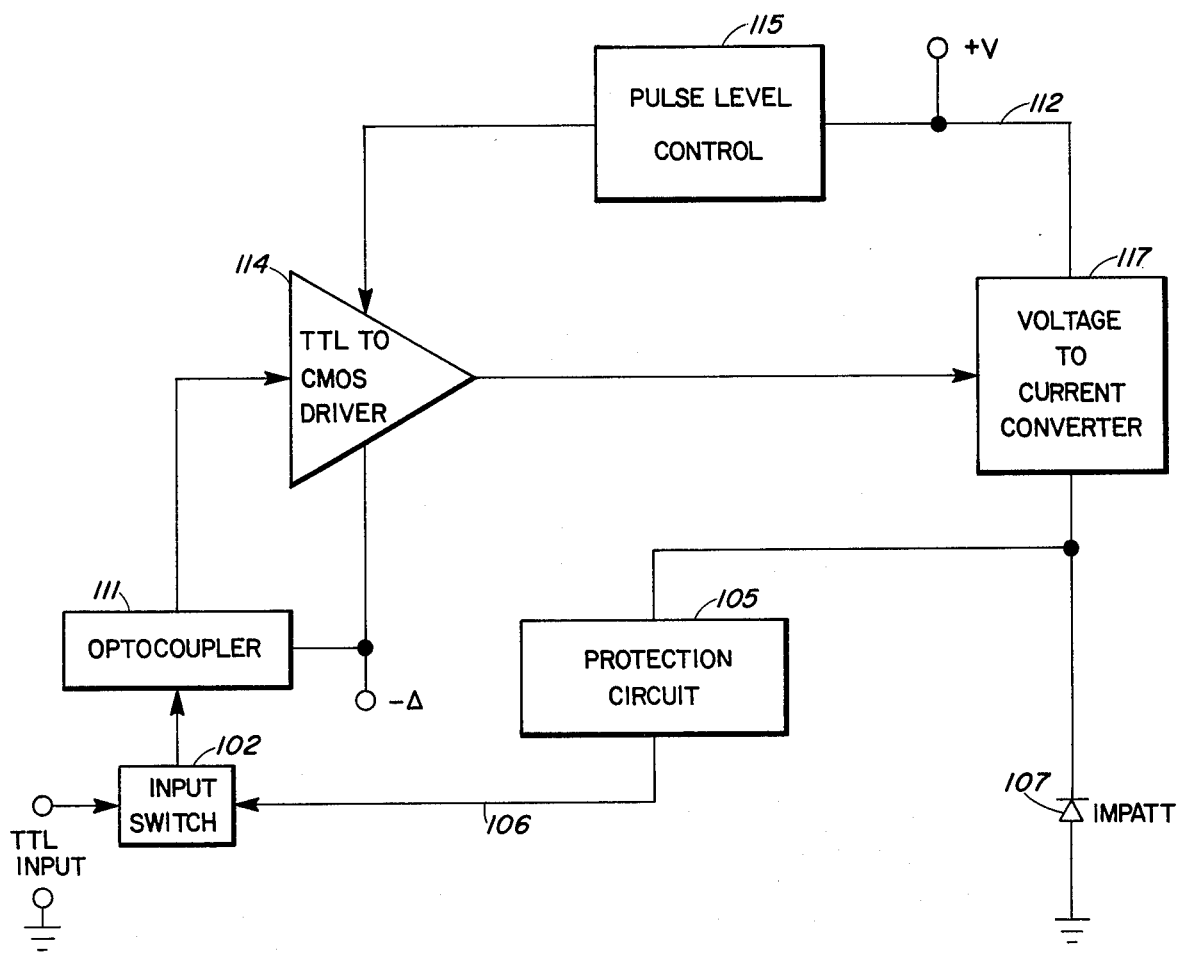
FIG. 1 illustrates a block diagram of the proposed circuit.

Referring to FIG. 1, a block diagram of the circuit under consideration is illustrated depicting major components of the circuit and the pulse propogation path. FIG. 1 is provided to be used in conjunction with the circuit schematic shown in FIG. 2 to aid in understanding interrelationship of components and circuit functions.

FIG. 1 shows a TTL input to an input switch 102 which transmits a signal to an optocoupler 111. The signal then continues through optocoupler 111 to TTL to CMOS driver 114 (Transistor-Transistor Logic to Complementary Metal Oxide Semiconductor). From driver 114 the signal carries through to a voltage-to-current converter 117 and thence to an IMPATT diode 107. A pulse level control circuit 115 is coupled between converter 117 and driver 114 and is provided with a positive voltage buss line 112. A protection circuit 105 is coupled between an IMPATT diode 107 and input switch 102 by line 106. Driver 114 and optocoupler 111 are provided with a common negative voltage source, $-\Delta$.

Figure 2:
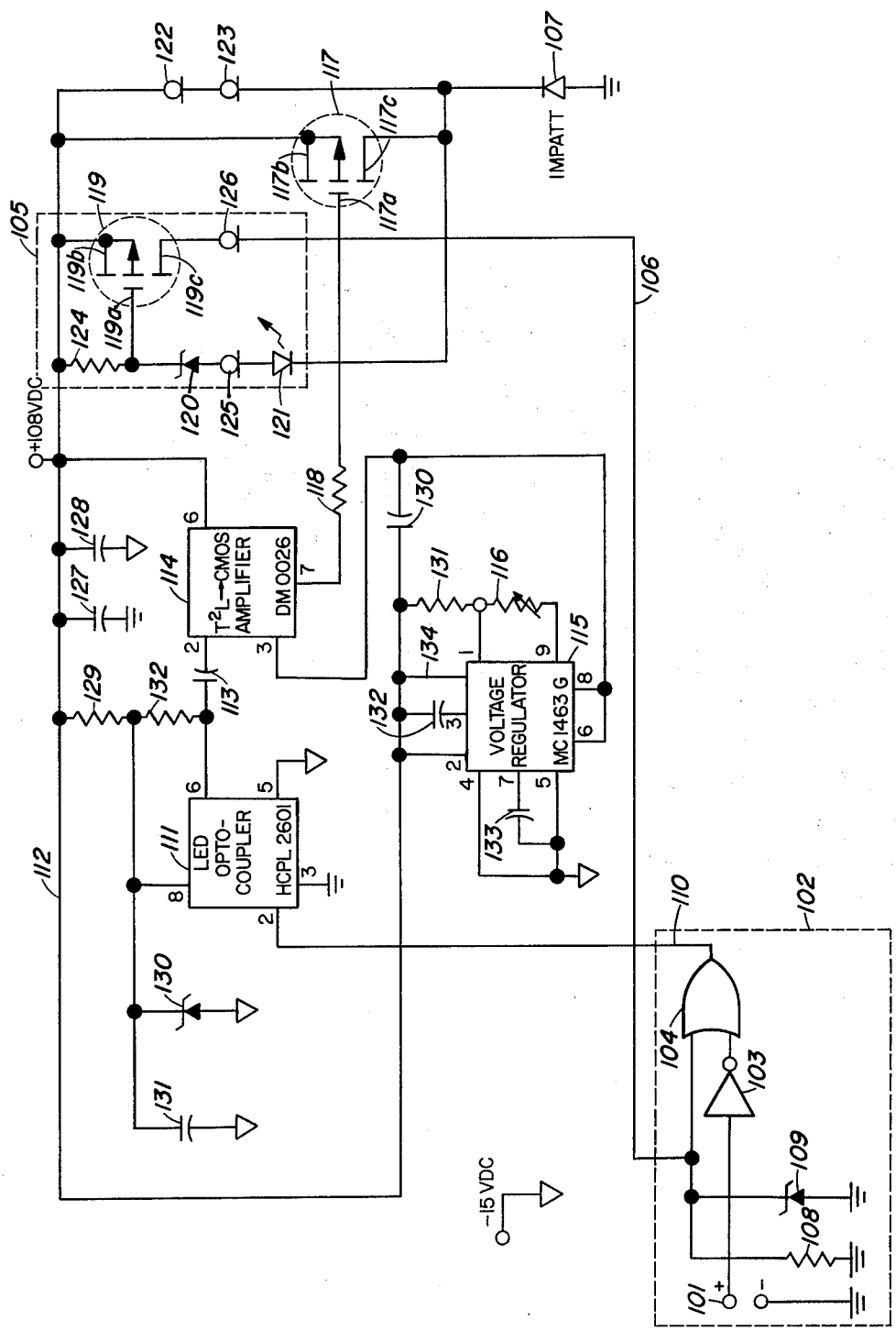
FIG. 2 illustrates a detailed schematic of the p-channel VMOS-FET pulse bias circuit.

Referring to FIG. 2, an input port 101 situated within input switch 102 receives an operating signal from a pulse generator. Input switch 102 is a TTL level circuit which permits interface compatibility with a wide variety of readily available pulse generators. Input switch 102 is provided with a 7404 inverter 103 and a 7432 OR gate 104 integrated circuits. An input signal from port 101 passes to inverter 103. Inverter 103 is used as an input port buffer, and is necessary to achieve a proper polarity of the input signal. The output of inverter buffer 103 is applied to one of the two input ports of OR gate 104. The other port of OR gate 104 is connected to a modulator protection circuit line 106 which will be covered later in this description. Pulses propagate through OR gate 104 unimpeded when protection circuit line 106 is not high. The output of OR gate 104 is applied to the input of HCPL 2601 optocoupler 111 via line 110. Optocoupler 111 circuit input is a TTL level signal that is referenced to a +108 VDC buss line 112 on pin 8 through a resistor 129 and is further capacitively coupled to −15 VDC through a capacitor 131 and is coupled to −15 VDC through a MZ 4625 zener diode 130. Since pin 5 is provided with a −15 VDC source in relation to the +108 VDC source at pin 8 a new reference ground for the output of optocoupler 111 at pin 6 is achieved as 93 VDC (108 VDC minus 15 VDC). The output signal of optocoupler 111 is still a TTL level signal but is floating on a reference ground 93 VDC higher than the input signal on pin 2.

Output, pin 6, of optocoupler 111 is coupled to +108 VDC buss line 112 by a plurality of resistors 129 and 132, and is capacitively coupled by a capacitor 113 to the input port, pin 2, of DM 0026 TTL to CMOS driver circuit 114. Driver 114 is coupled to +108 VDC buss line 112 at pin 6 and is coupled to an MC 1463 G pulse level control circuit/voltage regulator 115 at pin 3. Driver circuit 114 functions as an amplifier for TTL level input signals. The magnitude of this amplification output on pin 7 of driver circuit 114 is controlled by the amount of bias voltage applied to the driver device on pin 3. The amount of bias voltage applied to driver 114 is controlled by the variable voltage regulator circuit 115, which is functionally identified in the block diagram of FIG. 1 as a pulse level control circuit. The amount of bias voltage applied to driver circuit 114 is directly controlled by a 20K ohm potentiometer 116 connected between pins 1 and 9 of voltage regulator 115. Potentiometer 116 can be adjusted to provide pin 3 of driver circuit 114 with a 3.2 VDC bias at a minimum, and 15 VDC bias at a maximum. Therefore, the output pulses at pin 7 of driver circuit 114 can be anywhere from 3.2 VDC to 15 VDC in amplitude.

Since driver circuit 114 input, pin 2, is capacitively coupled to the previous stage, the input is an AC signal having both positive and negative polarities. Driver 114 is therefore capable of providing both positive and negative polarity pulses at pin 7, with respect to the +108 VDC high voltage buss 112 at pin 6. Output pulse on pin 7 of driver circuit 114 through a resistor 118 to a gate 117a of a VP 0335 N1 VMOS-FET (Vertical Metal Oxide Semiconductor-Field Effect Transistor) 117 indicates that the absolute pulse amplitude is approximately 15 VDC. Power VMOS-FET 117 is used as a voltage-to-current converter circuit and requires negative polarity pulses to gate 117a to turn the device on. If pulses are of a positive polarity, or are not greater than −1.8 VDC in negative polarity amplitude, then VMOS-FET 117 is turned off and will not allow a current to flow from source 117b which is attached to the +108 VDC buss line 112 through a drain 117c to IMPATT diode 107. The pulse actually has +3.2 VDC of its 15 VDC positive polarity amplitude; the remaining −11.8 VDC is of negative polarity and will be responsible for turning VMOS-FET 117 on. This small amount of positive polarity will aid VMOS-FET 117 in turning off rapidly also.

P-channel power VMOS-FET 117, as stated above, is the voltage-to-current converter device that applies the proper voltage and current pulses to IMPATT diode 107. Transistor 117 has a threshold voltage of 1.8 VDC (i.e. gate 117a must be biased 1.8 VDC lower in potential than source 117b of transistor 117). When this bias condition is met, current will be allowed to flow through drain 117c of transistor 117 to IMPATT diode 107. Transistor 117 behaves as a variable resistor which is dependent upon the gate-to-source voltage. When the gate-to-source voltage is less than 1.8 VDC, transistor 117 has an infinite amount of resistance, but when the gate-to-source potential reaches threshold voltage, the resistance decreases and current flow is initiated. As the gate-to-source voltage is increased from the threshold voltage, the resistance decreases until the device is saturated. At saturation, transistor 117 exhibits its minimum resistance to current flow. This is the mode of operation that is desired for the pulse bias circuit. Saturation for transistor 117 occurs at a gate-to-source potential of 8 VDC and the pulse applied to the gate is well above this potential. Therefore, the device is operated into saturation thus allowing maximum energy efficiency.

Protection circuit 105 comprises a p-channel VMOS-FET 119 and its associated gate circuitry. Circuit 105 is designed to monitor the voltage level across transistor 117. Circuit 105 is designed to function with IMPATT diode 107 which has an operating voltage of 100 volts, an operating current of 0.8 amps, and a breakdown voltage of 62 volts with a 2 milliamp current flow.

Although the described invention uses a Microwave Associates diode in this application, it is understood that an alternative manufacturer or a different diode may be used in its place. When IMPATT diode 107 is at breakdown, the voltage seen across transistor 117 is 46 volts (108 volts minus 62 volts). This 46 volt potential will be the maximum potential seen across transistor 117 because during operation the voltage across IMPATT 107 will be 100 volts and this will only leave an 8 volt potential across transistor 117. The potential across transistor 117 is monitored by a 1N 4126 zener diode 120 connected to gate 119a of a transistor 119. Zener diode 120 is a 51 volt diode, which means that protection circuit 105 will not trigger until the voltage across transistor 117 exceeds this 51 volt level. When the 51 volt potential is exceeded, zener diode 120 will avalanche allowing a current flow through a current limiting diode 125 to a HLMP 3600 LED 121. LED 121 will turn on indicating that the protection circuit is active. When zener diode 120 avalanches, a gate 119a potential of transistor 119 is pulled lower than a source 119b potential, which allows current to flow through transistor 119 from +108 VDC buss line 112 through a drain 119c, passing through a current limiting diode 126 along line 106 back to input switch 102 through a resistor 108 and a MZ 4625 zener diode 109. Diode 109 raises the voltage level of line 106 from ground potential to a 3 volt level to disable input switch 102 and prevent pulses to be propagated through the circuit.

Two constant current diodes (1N 5305) 122 and 123 connected in series are in parallel with transistor 117. Diodes 122 and 123 allow a current flow of 2 milliamps to IMPATT diode 107 at all times. This small current flow will bias IMPATT 107 at breakdown voltage. IMPATT diode 107 is generally held at breakdown during its off state to allow the diode junction to be preheated by the current flow. This preheating allows diode 107 to break into microwave oscillation (Radio Frequency) with less frequency chirp and greater stability than when the junction is not preheated. The +108 VDC buss line 112 is coupled to ground and to the −15 VDC source through a plurality of capacitors 127 and 128 to provide stability to the circuit during pulsing action.

Voltage regulator (pulse level control circuit) 115 is coupled directly to the +108 VDC buss line 112 at pin 2, through a capacitor 132 directly to the case through line 129, and also through a resistor 131 at pin 1. Voltage regulator 115 is connected to −15 VDC at pins 4, 7, and 5. Regulator 115 output, is provided at pins 6 and 8 and is capacitively coupled to buss line 112 by capacitor 130, and terminating at amplifier/driver 114 at pin 3.

Voltage and current pulses delivered to IMPATT diode 107 will now be discussed. The voltage pulse at IMPATT diode 107 is held constant at 100 volts, and the current pulse rising edge is at 0.9 amps with a falling edge of 0.8 amps. This current drop can be controlled with potentiometer 116 by reducing the amplitude of pulses being applied to gate 117a of transistor 117. Waveforms indicate that the bias circuit is operating at approximately 90% power efficiency. Therefore, if the amplitude of the pulses is decreased, the efficiency will be decreased. Voltage current rise time in the system as described is approximately 22 nanoseconds with a fall time of approximately 8 nanoseconds.

Radio Frequency energy (RF) emitted by IMPATT diode 107 has a waveform with the same duty factor and pulse width as the voltage current waveform at input 101. The RF energy rise time is approximately 6 nanoseconds and the fall time is approximately 12 nanoseconds. Waveforms clearly indicate that the RF energy rise time is much faster than the voltage current rise time. The RF energy fall time is several nanoseconds slower than the voltage current fall time due to the capacitive energy storage capability of IMPATT diode 107.

P-channel VMOS-FET 117 is a 350 volt device capable of delivering 2 amps of current flow. This device was selected because it offers a very high voltage along with a moderate current rating and the advantages of using p-channel devices. Power VMOS-FETs are used generally where a high voltage level rating is desired; however, they are readily available at much lower voltage ratings that will afford faster rise and fall times for RF energy, voltage and current pulses.

MODE OF OPERATION

The pulse bias circuit functions as follows. A pulse train of desired frequency, pulse width, and duty factor is applied at input port 101, buffered, and inverted through inverter 103 to OR gate 104. OR gate 104 delivers a high to optocoupler 111 when either or both of its inputs are high. Optocoupler 111 activates on a low at pin 2. Therefore, if either input of OR gate 104 is high, optocoupler 111 cannot receive a pulse from OR gate 104. Considering that a pulse is provided at pin 2 of optocoupler 111 it passes from pin 6 to pin 2 of driver 114 and is next amplified from TTL to CMOS by amplifier/driver 114. Again a pulsed output is provided at pin 7 of driver 114 and applied to gate 117a of transistor 117. Transistor 117 provides a surge of current to IMPATT diode 107 which avalanches causing an RF pulse similar in frequency and duty factor to the pulse applied at input switch 102. Should a short occur in IMPATT diode 107, the potential drop across resistor 119 will be sensed, it will then activate setting a high on line 106 by limiting diode 109, thereby causing OR gate 104 to go high which cuts off the pulse train.

Voltage regulator/pulse level control circuit 115 is provided with potentiometer 116 to permit variable control of the magnitude of pulse delivered by driver 114 to transistor 117 and thereby limit the amount of current flow therethrough to control the RF power generated by IMPATT diode 107.

Although there has been described hereinabove a particular arrangement of a pulse bias circuit for the purpose of illustrating the manner in which the invention may be used to advantage, it will be appreciated that the invention is not limited thereto. Accordingly, any and all modifications, variations, or equivalent arrangements which may occur to those skilled in the art should be considered to be within the scope of the invention as defined in the appended claims.

What is claimed is:

1. A bias circuit for delivering high voltage and current pulses of specified duty factors and pulse widths to an IMPATT diode to generate RF pulses, comprising:
   an input switch serving primarily as an inport buffer and to achieve a proper polarity of an input signal;
   voltage translation means coupled to said input switch for permitting voltage level translation of said input signal to a new ground reference without distorting said input signal;
   a driver circuit coupled to said voltage translation means to amplify said input signal;
   a pulse level control circuit coupled to said driver circuit to regulate the amount of bias voltage applied to said driver circuit and thereby regulate the magnitude of amplification of said driver circuit;
   voltage to current converter means coupled to said driver for passing a sufficient voltage and current pulse to said IMPATT diode;
   an IMPATT diode coupled to said voltage to current converter means to generate an RF pulse; and
   a protection circuit coupled between said voltage to current converter means and said input switch to monitor voltage levels across said converter means and shut off said input switch when said IMPATT diode shorts out.

2. A bias circuit according to claim 1, wherein said input switch comprises an OR gate with a control signal inverter-buffer for a first input, and said protection circuit feed for a second input.

3. A bias circuit according to claim 1, wherein said voltage translation means comprises an optocoupler circuit.

4. A bias circuit according to claim 1, wherein said driver circuit changes the signal from a TTL level to a CMOS level.

5. A bias circuit according to claim 1, wherein said voltage to current converter means comprises a p-channel VMOS-FET.

6. A bias circuit according to claim 5, wherein the gate of said VMOS-FET is regulated by said driver circuit.

7. A bias circuit according to claim 5 wherein the source of said VMOS-FET is coupled to a power supply.

8. A bias circuit according to claim 5 wherein the drain of said VMOS-FET is coupled to said IMPATT diode.

9. A bias circuit according to claim 5 wherein said VMOS-FET is wired in parallel to at least one current limiting diode.

10. A bias circuit according to claim 1 wherein said protection circuit comprises a p-channel VMOS-FET.

11. A bias circuit according to claim 10 wherein the gate of said VMOS-FET is regulated by the voltage level across a resistor and zener diode in parallel to said voltage to current converter means.

12. A bias circuit according to claim 10 wherein the source of said VMOS-FET is coupled to a power supply.

13. A bias circuit according to claim 10 wherein the drain of said VMOS-FET is coupled to said input switch through at least one current limiting diode.

14. A bias circuit according to claim 10 wherein said protection circuit contains at least one current limiting diode in series with at least one LED to indicate when said IMPATT diode is shorted out.

* * * * *